(12) United States Patent
Nezafat et al.

(10) Patent No.: US 8,169,218 B2
(45) Date of Patent: May 1, 2012

(54) METHODS AND APPARATUS FOR NON-CONTRAST ENHANCED PULMONARY MAGNETIC RESONANCE IMAGING

(75) Inventors: Reza Nezafat, Newton, MA (US); Peng Hu, Boston, MA (US)

(73) Assignee: Beth Israel Deaconess Medical Center, Inc., Boston, MA (US)

( * ) Notice: Subject to any disclaimer, the term of this patent is extended or adjusted under 35 U.S.C. 154(b) by 275 days.

(21) Appl. No.: 12/426,658

(22) Filed: Apr. 20, 2009

(65) Prior Publication Data

US 2010/0060277 A1    Mar. 11, 2010

Related U.S. Application Data

(60) Provisional application No. 61/046,142, filed on Apr. 18, 2008.

(51) Int. Cl.
*G01V 3/00* (2006.01)
(52) U.S. Cl. ...................................... 324/309
(58) Field of Classification Search .......... 324/300–322; 600/410–435
See application file for complete search history.

(56) References Cited

U.S. PATENT DOCUMENTS

| | | | | |
|---|---|---|---|---|
| 5,320,099 A | * | 6/1994 | Roberts et al. | 600/413 |
| 5,417,214 A | * | 5/1995 | Roberts et al. | 600/413 |
| 6,320,377 B1 | * | 11/2001 | Miyazaki et al. | 324/306 |
| 6,850,063 B2 | | 2/2005 | Hennig | |
| 6,903,548 B2 | | 6/2005 | Foo | |
| 7,254,437 B2 | * | 8/2007 | Miyazaki | 600/410 |
| 7,308,298 B2 | * | 12/2007 | Miyazaki | 600/410 |
| 7,479,783 B2 | | 1/2009 | Alsop | |
| 2008/0221429 A1 | | 9/2008 | Nezafat et al. | |

OTHER PUBLICATIONS

Alsop, D., "The Sensitivity of Low Flip Angle RARE Imaging," *Magnetic Resonance in Medicine*, 1997, vol. 37, pp. 176-184.
Hennig, J., et al., "Multiecho Sequences With Variable Refocusing Flip Angles: Optimization of Signal Behavior Using Smooth Transitions Between Pseudo Steady States (TRAPS)," *Magnetic Resonance in Medicine*, 2003, vol. 49, pp. 527-535.
Edelman, R. R., et al., "Gadolinium-Enhanced Off-Resonance Contrast Angiography," *Magnetic Resonance in Medicine*, 2007, vol. 57, pp. 475-484.
Nezafat, R., et al., "Coronary Magnetic Resonance Vein Imaging: Imaging Contrast, Sequence, and Timing," *Magnetic Resonance in Medicine*, 2007, vol. 58, pp. 1196-1206.

* cited by examiner

*Primary Examiner* — Dixomara Vargas
(74) *Attorney, Agent, or Firm* — Wolf, Greenfield & Sacks, P.C.

(57) ABSTRACT

In one aspect, a method of inducing nuclear magnetic resonance (NMR) signals from a region of an object having at least a portion of at least one pulmonary vein using at least one coil adapted to emit electromagnetic signals to induce an NMR effect is provided. The method comprises operating the at least one coil to provide at least one imaging sequence at an effective off-resonance frequency adapted to cause NMR signals to be emitted from the at least one pulmonary vein, and detecting at least some of the NMR signals to obtain NMR data corresponding to the at least one pulmonary vein.

32 Claims, 10 Drawing Sheets

FIG. 4A  FIG. 4B  FIG. 4C  FIG. 4D  FIG. 4E  FIG. 4F

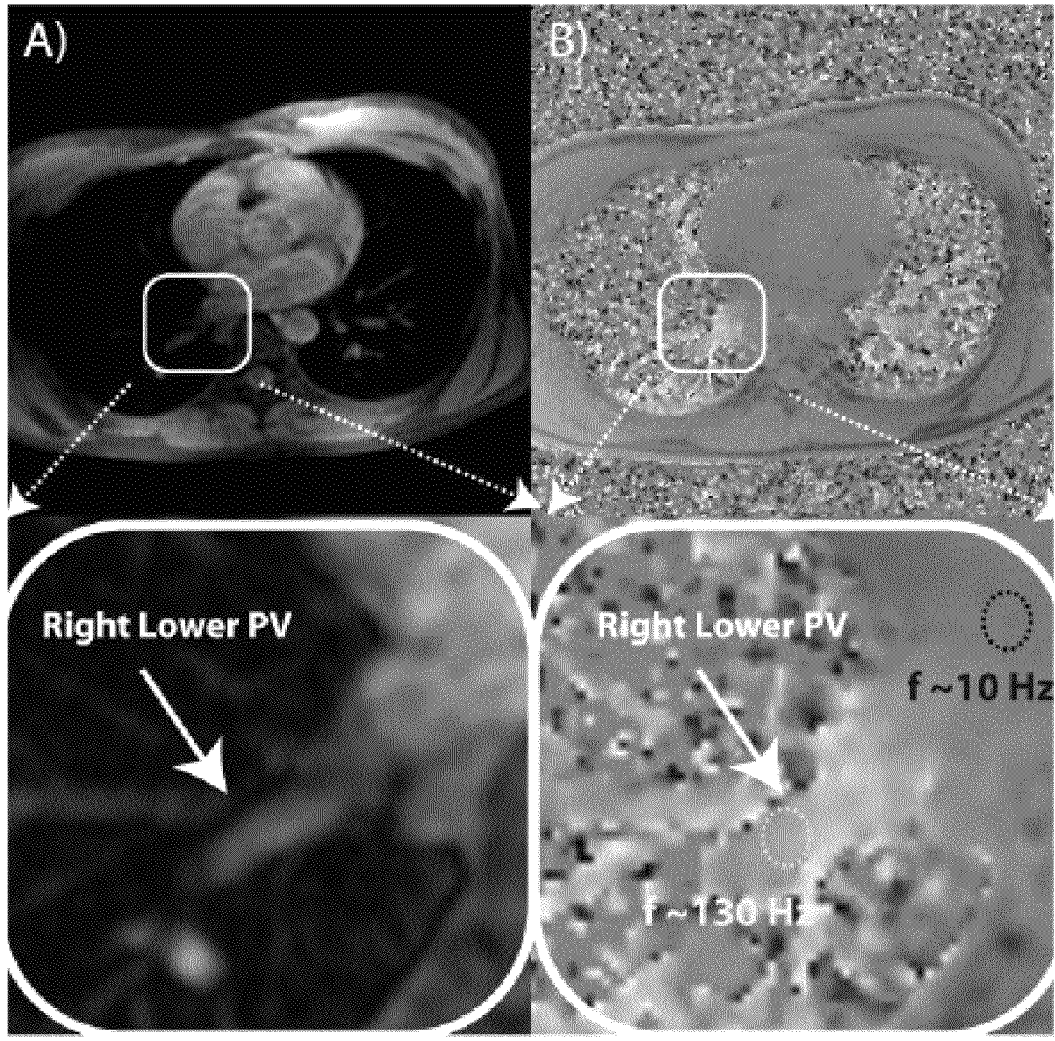
*FIG. 6A*  *FIG. 6B*

US 8,169,218 B2

METHODS AND APPARATUS FOR NON-CONTRAST ENHANCED PULMONARY MAGNETIC RESONANCE IMAGING

CROSS-REFERENCE TO RELATED APPLICATION

This application claims the benefit under 35 U.S.C. §119 (e) of U.S. Provisional Application 61/046,142, filed Apr. 18, 2008, entitled "OFF-RESONANCE PULMONARY VEIN ANGIOGRAPHY," which is incorporated herein in its entirety.

FIELD OF THE INVENTION

The technology described in this application relates to imaging of pulmonary veins (PVs).

BACKGROUND OF THE INVENTION

Magnetic resonance (MR) imaging may be broadly categorized by whether or not a contrast agent is used. Non-contrast MR imaging (MRI) utilizes one or more intrinsic properties of a subject to generate contrast for producing an image of the subject. More specifically, differences in one or more properties of tissues can be exploited to provide contrast between a target tissue and surrounding tissue. Alternatively, in contrast enhanced MRI, a contrast agent is administered to a test subject. The contrast agent permeates a target tissue (e.g., blood or a designated organ) and generates the necessary contrast between the target and surrounding tissues to produce the resulting image of the subject.

The pulmonary veins (PV) are frequently the subject of MR imaging. In particular, various medical procedures involve working with PVs. Imaging of PVs is often performed before such medical procedures, to facilitate planning of the procedure. Imaging is also often performed post-procedure to assess the results of the procedure. Conventionally MR angiography, and more particularly PV imaging, is performed using a contrast agent. A common contrast agent used for MR angiography of PVs is gadolinium (Gd), which causes a shift in the resonant frequency of a subject to which it is administered. The shift in resonant frequency is utilized to produce the contrast enhanced image.

SUMMARY OF THE INVENTION

Some embodiments include a method of inducing nuclear magnetic resonance (NMR) signals from a region of an object having at least a portion of at least one pulmonary vein using at least one coil adapted to emit electromagnetic signals to induce an NMR effect, the method comprising operating the at least one coil to provide at least one imaging sequence at an effective off-resonance frequency adapted to cause NMR signals to be emitted from the at least one pulmonary vein, and detecting at least some of the NMR signals to obtain NMR data corresponding to the at least one pulmonary vein.

Some embodiments include a computer readable medium having processor-executable instructions stored thereon, the processor-executable instruction, when executed by at least one processor, performing a method of inducing nuclear magnetic resonance (NMR) signals from a region of an object having at least a portion of at least one pulmonary vein using at least one coil adapted to emit electromagnetic signals to induce an NMR effect, the method comprising operating the at least one coil to provide at least one imaging sequence at an effective off-resonance frequency adapted to cause NMR signals to be emitted from the at least one pulmonary vein, and detecting at least some of the NMR signals to obtain NMR data corresponding to the at least one pulmonary vein.

Some embodiments include a system for inducing nuclear magnetic resonance (NMR) signals from a region of an object having at least a portion of at least one pulmonary vein, the system comprising at least one coil adapted to emit electromagnetic signals to induce an NMR effect, at least one detector adapted to detect at least some of the NMR signals emitted from the region, and at least one controller to operate the at least one coil to provide at least one imaging sequence at an effective off-resonance frequency adapted to cause NMR signals to be emitted from the at least one pulmonary vein, and to operate the at least one detector to detect at least some of the NMR signals to obtain NMR data corresponding to the at least one pulmonary vein.

BRIEF DESCRIPTION OF THE DRAWINGS

FIGS. 4A-4F illustrate images acquired using different frequency offsets from 0-125 Hz offsets;

FIGS. 6A and 6B illustrate an image of a portion of the heart and a corresponding effective off-resonance field map;

DETAILED DESCRIPTION

Figure 1:
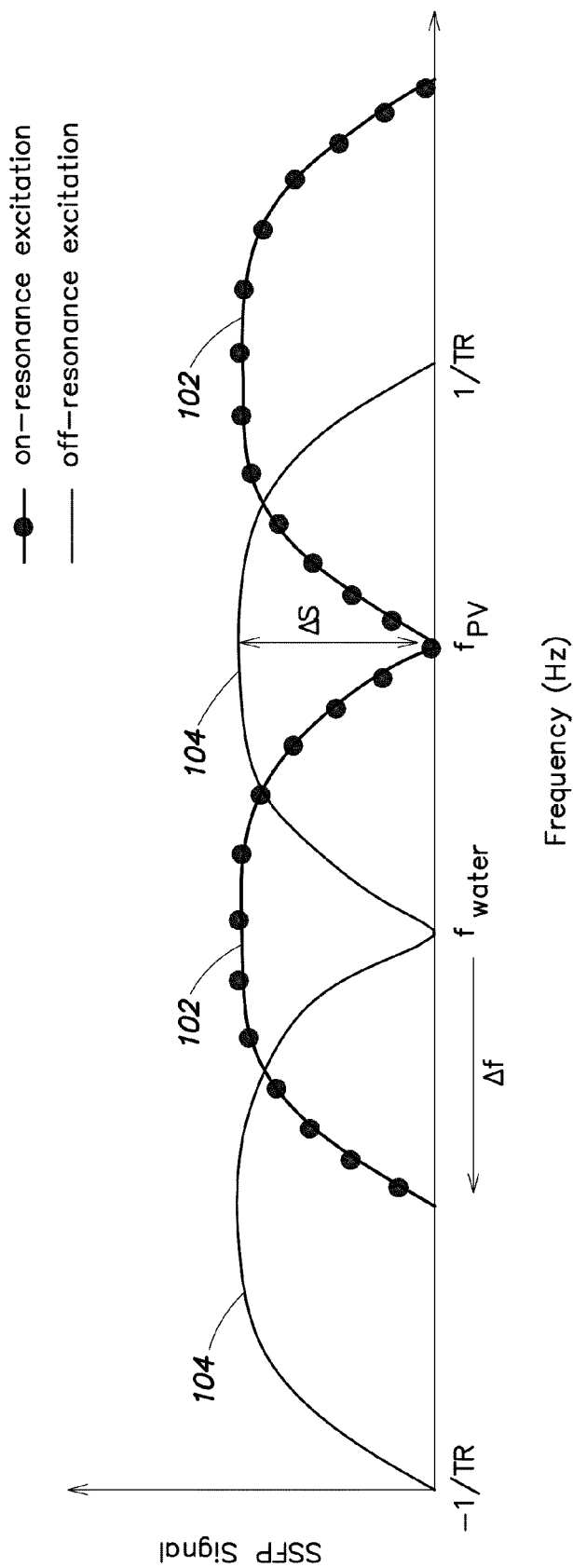
FIG. 1 illustrates a schematic representation of on-resonance and effective off-resonance excitation.

Recently, it has been appreciated that the use of contrast agents, such as Gd, in contrast enhanced MR angiography of PVs has adverse health implications. In particular, association has been made between Nephrogenic Systomic Fibrosis (NSF) and the use Gd contrast agents in patients with renal insufficiency. As a result, the FDA has advised against the use of contrast agents in patients with impaired renal function. However, MR PV imaging is known to produce relatively low resolution, low contrast images when performed without a contrast agent. Applicant has developed a non-contrast MR angiography technique that utilizes characteristics of PVs to produce images having suitable contrast. The non-contrast technique involves effective off-resonance MR angiography of PVs, i.e., the application to the PVs of radio frequency (RF) excitation signals at a frequency offset from the resonant frequency of water.

The suitability of effective off-resonance techniques for MR angiography of PVs is facilitated by Applicants' discovery and quantization of the resonant frequency of blood in the PVs. The effective off-resonance MR angiography techniques described herein offer benefits compared to conventional contrast enhanced imaging. First, the non-contrast MR angiography techniques described herein provide suitable contrast for imaging PVs. Further, because the techniques described herein do not involve the use of contrast agents, the cost and time associated with procuring and administering contrast agents may be avoided. Accordingly, adverse medical conditions associated with the use of contrast agents may be avoided.

Off-resonance imaging may be achieved by at least two different techniques. A first technique includes applying an imaging sequence at a resonant frequency offset from the peak resonant frequency of water (or other reference resonant frequency). A second technique includes applying an imaging sequence substantially at the resonant frequency of water (or other reference resonant frequency) and shifting the phase of the imaging sequence such that the "effective" frequency is at the resonant frequency offset. Accordingly, the term "effective off-resonance" and "effective off-resonance frequency" are used to describe either frequency and/or phase shifting to perform off-resonance imaging.

According to some aspects, a method of effective off-resonance MR angiography of PVs is provided. The method comprises applying to a PV an RF excitation signal having a frequency offset from that of the resonant frequency of water in the range from approximately 50 Hz to 150 Hz. The PV may have no contrast agent introduced therein. The method may further comprise detecting a response signal generated by blood in the PV, for example using an RF receiver coil. According to some embodiments, the RF excitation signal may have a frequency offset from that of the resonant frequency of water in the range from approximately 75 Hz to 125 Hz, or in the range from approximately 90 Hz to 110 Hz. In some embodiments, the RF excitation signal may have a frequency offset of approximately 100 Hz.

According to some aspects, an apparatus for performing effective off-resonance MR angiography of PVs is provided. The apparatus may comprise an imager and a module coupled to the imager to control the imager to apply an RF excitation signal to the PV of a subject being imaged. The module may be adapted to produce the RF excitation signal at a frequency offset from the resonant frequency of water in the range from approximately 50 Hz to 150 Hz. In some implementations, the RF signal may have a frequency offset of approximately 100 Hz. In some implementations, the imager includes an array of excitation coils and an array of receiver coils. The receiver coils may detect a signal generated by blood in a PV being imaged in response to the excitation RF signal.

In some implementations, the apparatus further comprises a link coupling the module to the imager. The link may be a wired or wireless link. The module may comprise a user interface enabling a user to program the imager, or to select operating parameters for the imager from a stored set of operating parameters, such that non-contrast PV imaging may be performed.

Some aspects include a computer readable medium encoded with a computer program (i.e., a plurality of instructions), which, when executed on a processor, performs a method for effective off-resonance MR angiography of PVs. The method may comprise applying to a PV an RF excitation signal having a frequency offset from that of the resonant frequency of water in the range from approximately 50 Hz to 150 Hz. The PV may have no contrast agent introduced therein. The method may further comprise detecting a response signal generated by blood in the PV, for example using an RF receiver coil. According to some embodiments, the RF excitation signal may have a frequency offset from that of the resonant frequency of water in the range from approximately 75 Hz to 125 Hz, or in the range from approximately 90 Hz to 110 Hz. In some embodiments, the RF excitation signal may have a frequency offset of approximately 100 Hz.

As discussed above, contrast agents used in contrast enhanced MR angiography of PVs (and other MR procedures performed with contrast agents) have been linked to certain medical problems. For example, use of Gd has been linked with NSF in patients with renal insufficiency. The lack of suitable non-contrast MR PV imaging techniques is problematic for patients undergoing treatments requiring evaluation of the PV anatomy, such as PV isolation using RF ablation to treat cardiac arrhythmia. Thus, Applicants have appreciated that new, non-contrast, MR angiography techniques for imaging PVs may be beneficial to, for example, facilitate medical procedures requiring relatively high contrast images of the PV anatomy.

Effective off-resonance imaging is a form of non-contrast imaging in which an RF excitation signal is applied to a subject, and the frequency of the RF excitation signal is chosen to correspond approximately to the resonant frequency of target subject matter, such as target tissue. If the target subject matter (e.g., a PV) has a resonant frequency distinguishable from that of surrounding subject matter (e.g., surrounding tissue), the difference between the resonant frequencies may generate sufficient contrast to create useful images. The technique is termed "off-resonance" imaging because the frequency of the applied RF signal is generally offset from the resonant frequency of water by an amount equal to the difference between the resonant frequency of the targeted material and the resonant frequency of water.

Applicant has appreciated that effective off-resonance MRI (one form of non-contrast imaging) of PVs is feasible and provides suitable contrast to form useful images of PVs. In particular, Applicant has recognized that the lung is a relatively high source of bulk magnetic susceptibility due to increased air-blood interactions, and appreciated therefore that due to the specialized anatomical function of PVs carrying fully oxygenated blood from the lungs to the heart, effective off-resonance imaging may by a suitable technique for selectively exciting the magnetization in PVs to obtain sufficiently high contrast images without using contrast agents. That is, Applicant has appreciated that the high bulk magnetic susceptibility of blood in PVs originating from the lungs results in the blood having a resonant frequency that is shifted substantially relative to the resonant frequency of water (or unoxygenated blood), and that is shifted substantially relative to the resonant frequency of materials surrounding the PVs, and also has a higher T2 than blood in other parts of the body. By leveraging this difference between the resonant frequency of blood in the PVs and surrounding materials, non-contrast effective off-resonance MR angiography of PVs can be achieved.

FIG. 1 is a simplified graphical representation of on-resonance and effective off-resonance excitation. The x-axis represents frequency in units of Hertz (Hz), and the y-axis represents a steady-state free precession (SSFP) signal. In an SSFP imaging sequence, a train of RF pulses is applied repeatedly with fully refocused imaging gradients between the pulses. The only source of phase accrual between the RF pulses is therefore the effective off-resonance precession frequency of spins. Thus, the SSFP signal may be used as a measure of effective off-resonance frequency. The spectral response of a SSFP sequence, such as that shown in FIG. 1, may be a function of T1, T2, flip angle, TR and effective off-resonance frequency.

Two imaging scenarios are shown in FIG. 1. First, line 102 represents on-resonance excitation. In particular, it can be seen that as the frequency of excitation approaches the resonant frequency of water, the resulting SSFP signal increases. Also shown by line 102 is that the spectral response is drastically reduced at some frequencies, which are referred to as null frequencies. The null frequencies for SSFP are located at +/−1/TR, in which TR is the repetition time and is defined as the time between RF excitation pulses. For on-resonance excitation, the null frequencies may be located near or at the resonant frequency of PVs. Line 104 represents effective off-resonance excitation. As shown, for effective off-resonance excitation, the SSFP signal from water is relatively small, as the null frequencies generally correspond to the resonant frequency of water. By contrast, the signal from PVs can be relatively large. The difference in frequency $\Delta f$ between the resonant frequency of water and detected null frequencies may be adjusted such that the maximum SSFP signal is present at an excitation signal corresponding to the resonant frequency of the PVs. When $\Delta f$ is suitably adjusted, the null frequency overlaps with on-resonance water spins ($f_{water}$), which leads to a PV signal enhancement of $\Delta S$ and on-resonance (water) signal suppression.

Applicant has appreciated that blood in the PVs has a resonant frequency effective off-resonance value of approximately 100 Hz, i.e., the difference between the resonant frequency of water and the resonant frequency of blood in the PVs. Furthermore, Applicant has appreciated that this property of PVs may be leveraged to provide beneficial non-contrast MR angiography of PVs, without the undesirable effects linked to the contrast agents used in conventional contrast enhanced imaging.

According to some embodiments, effective off-resonance MR angiography of PVs is performed without the use of a contrast agent. The effective off-resonance MR angiography may involve applying an excitation signal (e.g., a single pulse or a sequence of pulses) to a PV or system of PVs, for instance utilizing an RF excitation coil of an MRI machine. The excitation signal may have a frequency offset (i.e., may differ from the resonant frequency of water) in the range of approximately 50 Hz to approximately 150 Hz. A response signal may be detected and measured from the subject in response to application of the excitation signal. For example, an RF receiver coil, such as used in an MRI machine, may detect a response of the PV(s). The response signal may be processed to create an image of the PV(s). Many such response signals may be detected in practice, for example by an array of receiver coils. The response signals may be processed in combination to produce the resulting image.

Although an exemplary range of excitation frequencies was listed (i.e., frequency offsets ranging from 50 Hz-150 Hz), it should be appreciated that effective off-resonance MR angiography of PVs may utilize a different range of frequencies than that mentioned, such as a subset of the range of frequencies listed. For example, according to some embodiments, the excitation frequency for effective off-resonance MR angiography of PVs may have a frequency offset in the range of approximately 75 Hz-125 Hz. In some embodiments, the excitation frequency may have a frequency offset in the range of 90 Hz-110 Hz. Other frequency offsets are also possible, as the various aspects of the invention are not limited to any particular frequency offset.

Figure 2:
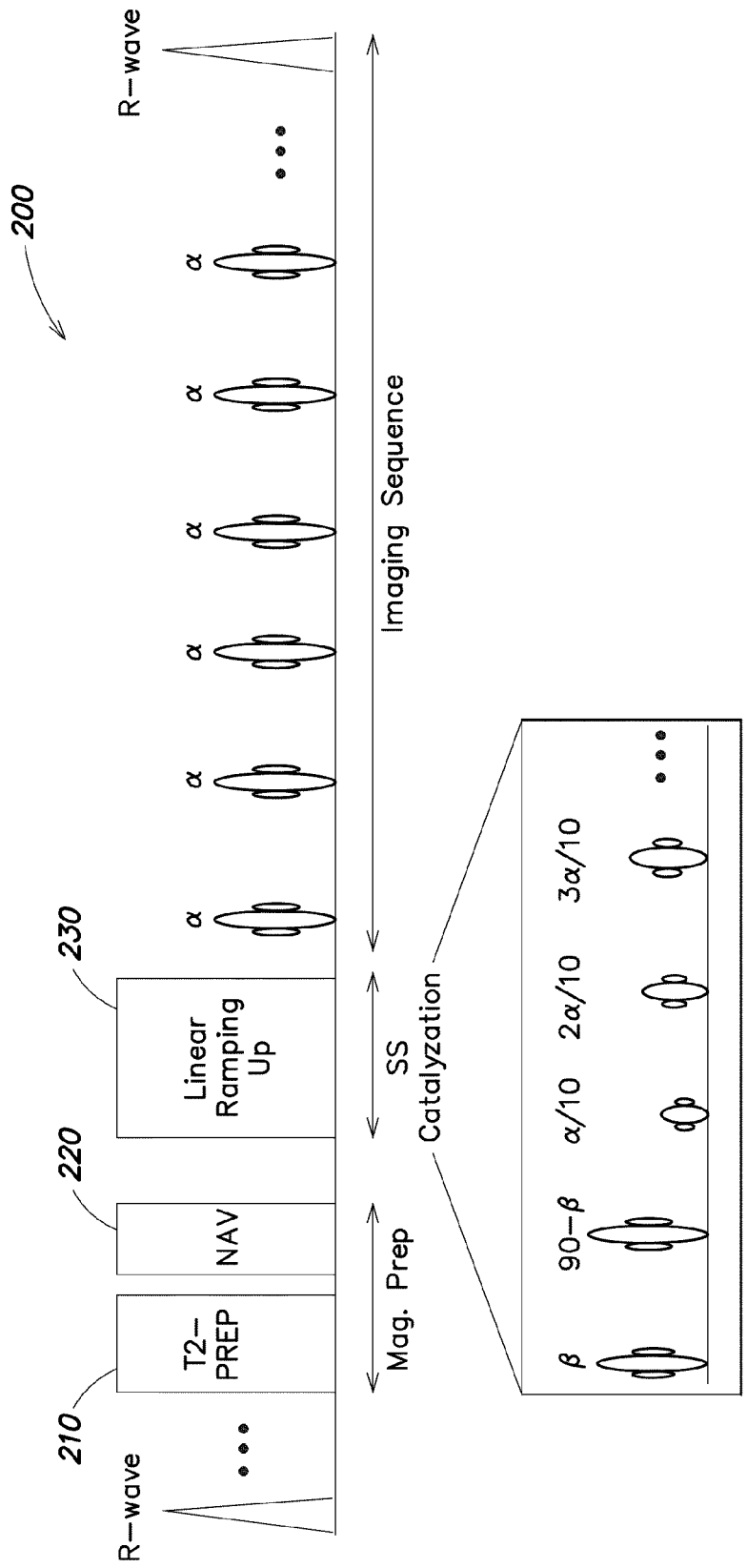
FIG. 2 illustrates an RF pulse sequence for performing effective off-resonance imaging of pulmonary veins, in accordance with some embodiments.
Figures 3A, 3B:
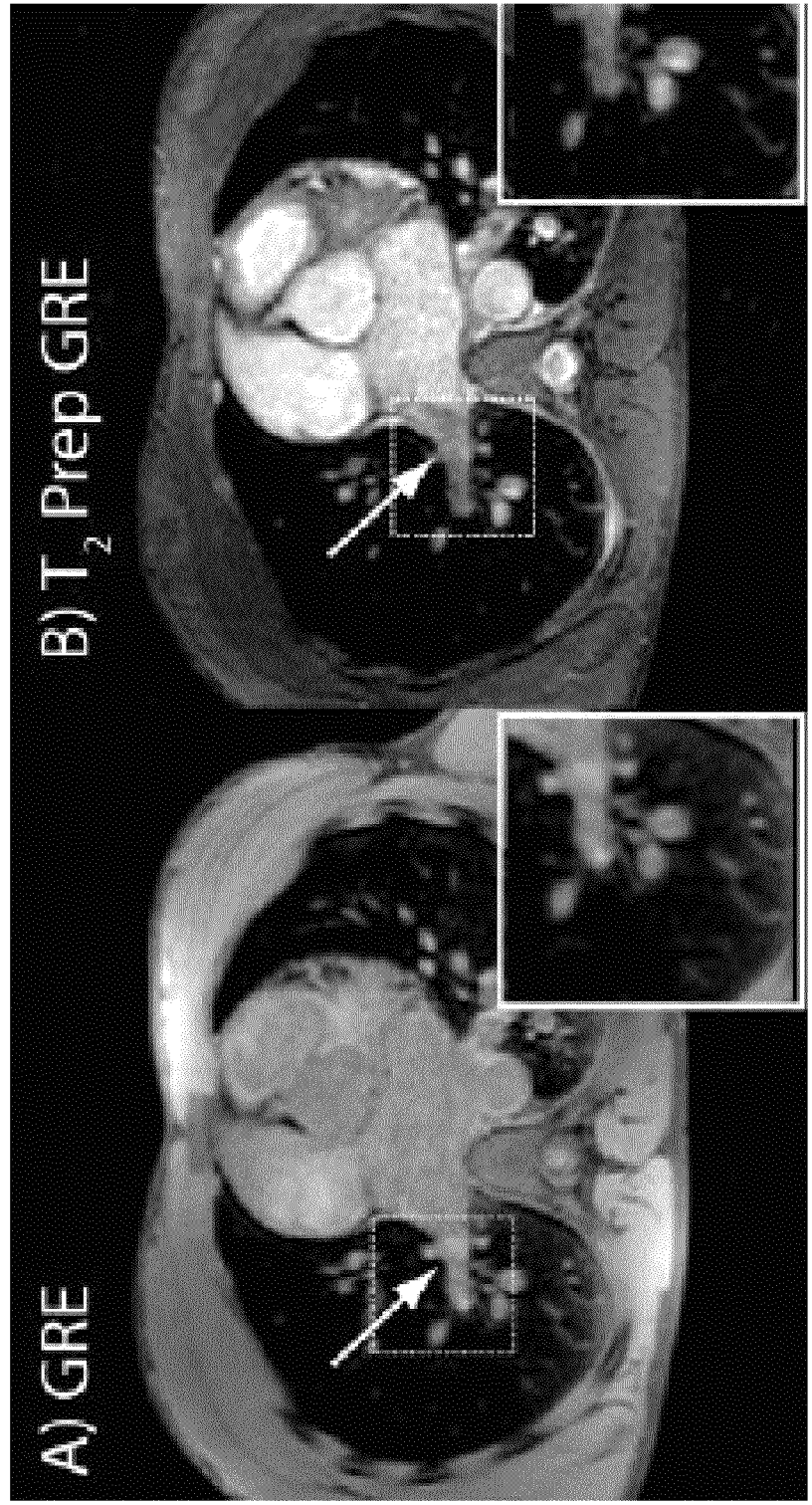
FIGS. 3A and 3B illustrate images without and with a $T_2$ preparation sequence, respectively.

FIG. 2 illustrates a sequence that may be used to perform effective off-resonance imaging of pulmonary veins according to some embodiments. Pulse sequence 200 may be formed from a number of individual sequences that together prepare a region for imaging and then acquire NMR signals from the region. For example, pulse sequence 200 may include a $T_2$ preparation sequence 210 adapted to condition the phase coherence of the region. Some suitable $T_2$ preparation sequences are described in U.S. Pat. No. 7,375,520, which is herein incorporated by reference in its entirety. While using a $T_2$ preparation sequence is not necessary or required, imaging results may be improved by doing so. For example, FIGS. 3A 3B illustrate images without and with a $T_2$ preparation sequence, respectively, showing an improvement in image quality when a $T_2$ preparation sequence is used prior to imaging.

Pulse sequence 200 may also include a navigator (NAV) sequence 220 to address motion artifacts that may result during imaging. For example, when imaging pulmonary veins, a patient's breathing and/or cardiac cycle may cause motion that results in artifacts in the acquired images. There are a number of known motion preparation sequences that may be suitable for compensating for at least some motion in a region during imaging. However, any motion preparation sequence may be used, as the aspects of the invention are not limited in this respect. While using a NAV or other motion preparation sequence is not necessary or required, imaging results may be improved by doing so.

Pulse sequence 200 may also include a ramp sequence 230 adapted to condition the region in a desired state (e.g., in a desired pseudo-steady state at a desired flip-angle). For example, the ramp sequence may comprise a plurality of RF pulses configured to establish a first flip angle in the region and to ramp up the flip angle to a final flip angle associated with the desired state. In particular, it has been recognized that magnetization may be beneficially transferred into a so-called pseudo-steady state (PSS) using a sequence of pulses. A NS is characterized by a magnetization state that is relatively insensitive to RF pulse amplitude (i.e., a PSS is generally resistant to RF field inhomogeneity).

Pseudo-steady states are discussed in further detail in: 1) "The Sensitivity of Low Flip Angle RARE Imaging," Magnetic Resonance in Medicine (MRM), 37:176-184 (1997), David Alsop; 2) "Multiecho Sequences With Variable Refocusing Flip Angles: Optimization of Signal Behavior Using Smooth Transitions Between Pseudo Steady States (TRAPS)," Magnetic Resonance in Medicine (MRM), 49:527-35 (2003), Hennig J. et al.; and 3) U.S. Pat. No. 6,850,063, all of which are herein incorporated by reference in their entireties. Achieving a PSS may be desirable due to its observed insensitivity to RF amplitude. The relative insensitivity to field inhomogeneity reduces image artifacts in the region being imaged producing higher quality images.

One method of achieving a desired PSS in a region is to establish a first PSS at a relatively low flip-angle. Once the first PSS has been achieved, a transitioning pulse sequence may be applied to increase the flip-angle of the PSS. In one embodiment, a preparation pulse sequence is generated and provided to the sample to condition the spins to achieve a zero or low flip-angle PSS. After the preparation sequence is applied, a transitioning pulse sequence may be applied to transfer the magnetization to pseudo-steady states having higher flip-angles until a desired flip-angle PSS is achieved. That is, the transitioning pulse ramps up the flip-angle as illustrated in FIG. 2. Some suitable ramp sequences are described in U.S. Pat. No. 7,479,783, which is herein incorporated by reference in its entirety. While using a ramp or other adiabatic pulse sequence to establish a PSS at a desired flip-angle, or other similar ramp sequence is not necessary or required, imaging results may be improved by doing so.

Pulse sequence 200 also includes imaging sequence to excite NMR signals at an effective off-resonance frequency to obtain image data corresponding to pulmonary veins. Some embodiments of suitable imaging sequences including exemplary imaging parameters are discussed herein. However, any imaging sequence capable of obtaining effective off-resonance PV image data may be used, as the aspects of the invention are not limited in this respect. It should be appreciated that the various preparation sequences illustrated in FIG. 2 are optional. None, one or any combination of preparation sequences may be used, as the aspects of the invention are not limited in this respect. Additional preparation sequences such as MT magnetization sequences may additionally be used.

It should be appreciated that effective off-resonance MR angiography of PVs may be accomplished using any suitable imaging parameters, and the various aspects of the invention are not limited to any particular set of imaging parameters. For example, effective off-resonance imaging of PVs using RF excitation signals having frequency offsets in the range from approximately 50 Hz-150 Hz (or any other suitable frequency offset or range of frequency offsets) may utilize steady-state free precession (SSFP) sequences, or any other suitable imaging sequence. Pre-saturation RF pulses may be applied in some embodiments. Respiratory motion compensation may be employed, and a saturation sequence for suppression of the fat signal around PVs may be used. Also, parameters such as field of view, spatial resolution, magnetic field strength, etc. may be selected depending on characteristics of the subject being imaged, desired image characteristics, or any other considerations, as the various aspects of the invention are not limited in this respect.

An exemplary set of imaging parameters, according to some embodiments of the invention, is provided below for purposes of illustration. In this non-limiting example, effective off-resonance MR angiography of PVs was performed using a 1.5 Tesla (T) Achieva MRI machine (available from Philips Medical Systems) with a 16 channel cardiac array (available from Invivo Corporation). A navigator-gated, electrocardiogram (ECG)-triggered, fat saturated, 3D SSFP single phase imaging sequence was performed. A trigger delay of 300 milliseconds was used, corresponding approximately to the maximum size of PVs. The field of view (FOV) used was FOV=270×270×100 mm$^3$. Additional parameters included TE/TR/α=2.3 ms/4.7 ms/90 degrees. A spatial resolution of 1.5×1.5×3 mm$^3$ reconstructed to 0.75×0.75×1.5 mm$^3$ with an acceleration rate of 2 was used. An axial image prescription, such as those commonly used for contrast enhanced imaging was also used.

A sequence of images was then taken using different frequencies for the RF excitation signal. In particular, the RF excitation signal offset was incremented from 0 Hz to 125 Hz in 25 Hz increments. FIGS. 4A-4F show the resulting images. As shown, improved contrast of the PVs relative to surrounding tissue results for frequency offsets of approximately 75 Hz, 100 Hz, and 125 Hz.

Figures 5A, 5B:
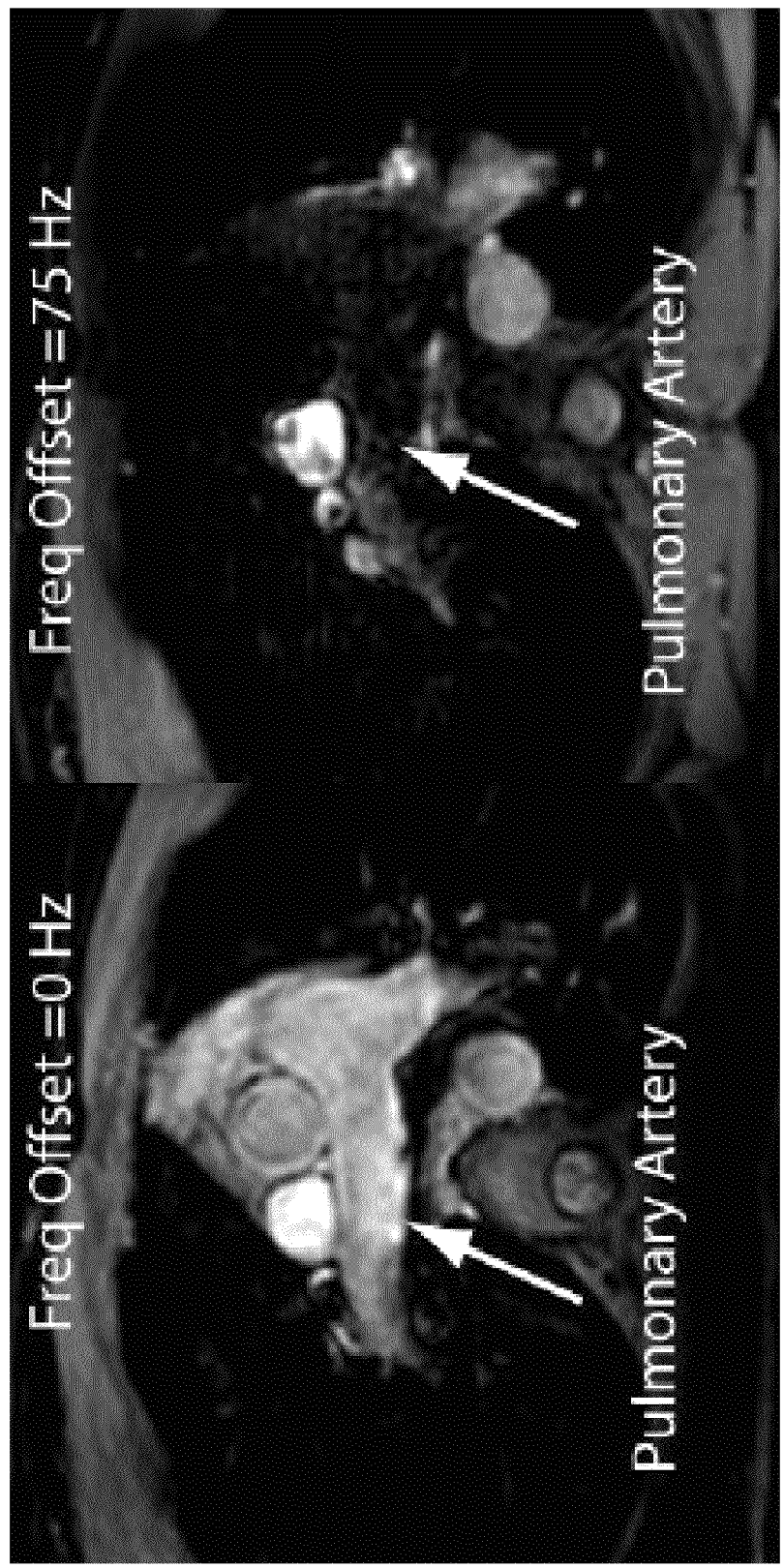
FIGS. 5A and 5B illustrate images acquired at 0 Hz and 75 Hz offset, respectively.

FIGS. 5A-5B are images similar to those shown in FIGS. 4A-4F, taken at RF excitation frequency offsets of 0 Hz and 75 Hz, respectively. These images illustrate that effective off-resonance MR angiography according to aspects of the invention may achieve effective suppression of contrast from the pulmonary artery. For example, as illustrated in FIG. 5B, improved suppression of pulmonary arteries may be obtained with RF excitation signals having frequency offsets of approximately 75 Hz, as compared to RF excitation signals have a frequency offset of 0 Hz.

It will be appreciated that FIGS. 4A-4F, and 5A-5B are merely examples. The quantity and/or quality of contrast obtained by effective off-resonance MR angiography of PVs according to aspects of the invention may depend to some degree on imaging parameters other than the frequency of the applied RF excitation signal (e.g., the trigger delay, FOV, magnetic field strength, etc.). Also, factors such as the unique characteristics of a given subject, and the cardiac cycle may impact the resulting image.

FIG. 6B illustrates an effective off-resonance field map of parts of the heart, i.e., it illustrates the resonant frequency of different parts of the heart compared to the resonant frequency of water. FIG. 6A is an image of the portion of the heart to which the field map of FIG. 6B corresponds. As shown in FIG. 6B, the resonant frequency for blood in the PVs differs substantially from that of surrounding tissue. In particular, as shown in FIG. 4B, a mean resonance frequency offset of approximately 130 Hz was measured in the PVs, compared to a mean resonance frequency offset of approximately 10 Hz in the atrium. The difference between the mean resonance frequencies enables effective off-resonance MR angiography of PVs.

According to an aspect of the invention, an apparatus is provided for performing effective off-resonance MR angiography of PVs. The apparatus may comprise an imaging module, adapted to control an MRI machine to provide RF excitation signals, such as RF pulses, to a subject. The response to the excitation signals may be read out and processed to produce a resulting image of the subject's PVs.

Described below are specific imaging sequences and results according to some embodiments. However, it should be appreciated that other imaging sequences, protocols and parameters may be suitable for effective off-resonance imaging of PV's, as the aspects of the invention are not limited in this respect. A multi-slice two dimensional (2D) gradient recalled echo (GRE) based sequence was developed to measure cardiac phased-resolved B0 field map of the PV and left atrium with a typical temporal resolution of 100 ms. Two echoes were acquired and used to calculate the field map according to the following equation:

$$f = \frac{\phi}{\Delta TE},$$

where f is the effective off-resonance frequency, ΔTE is TE difference between two echoes (2 ms in this study) and φ is the phase accrual during ΔTE period. An axial slice was prescribed with phase encoding direction being left-right to minimize respiratory motion artifacts. Data was acquired with 3 averages during free breathing without respiratory navigators. The imaging parameters were: TR=5.8 ms, $TE_1$=2.1 ms, $TE_2$=4.1 ms, FOV=220×400 mm$^2$, α=10°, spatial resolution of 2×2 mm$^2$ reconstructed to 1.25×1.25 mm$^2$, slice thickness=8 mm, 5-7 slices and 3 averages. The field map images were reconstructed on the Philips imaging console.

After initial test on phantom, the developed sequence was used to measure field map on 6 healthy subjects (2 male/4 female, age=22±3). The effective off-resonance of a PV/left atrium was measured by defining a region of interest (ROI) in the proximal PV/left atrium of the generated field maps and calculating the mean effective off-resonance frequency on the scanner console. A two-tailed t-test with p value <0.05 was assumed to be statistically significant.

Figure 7:
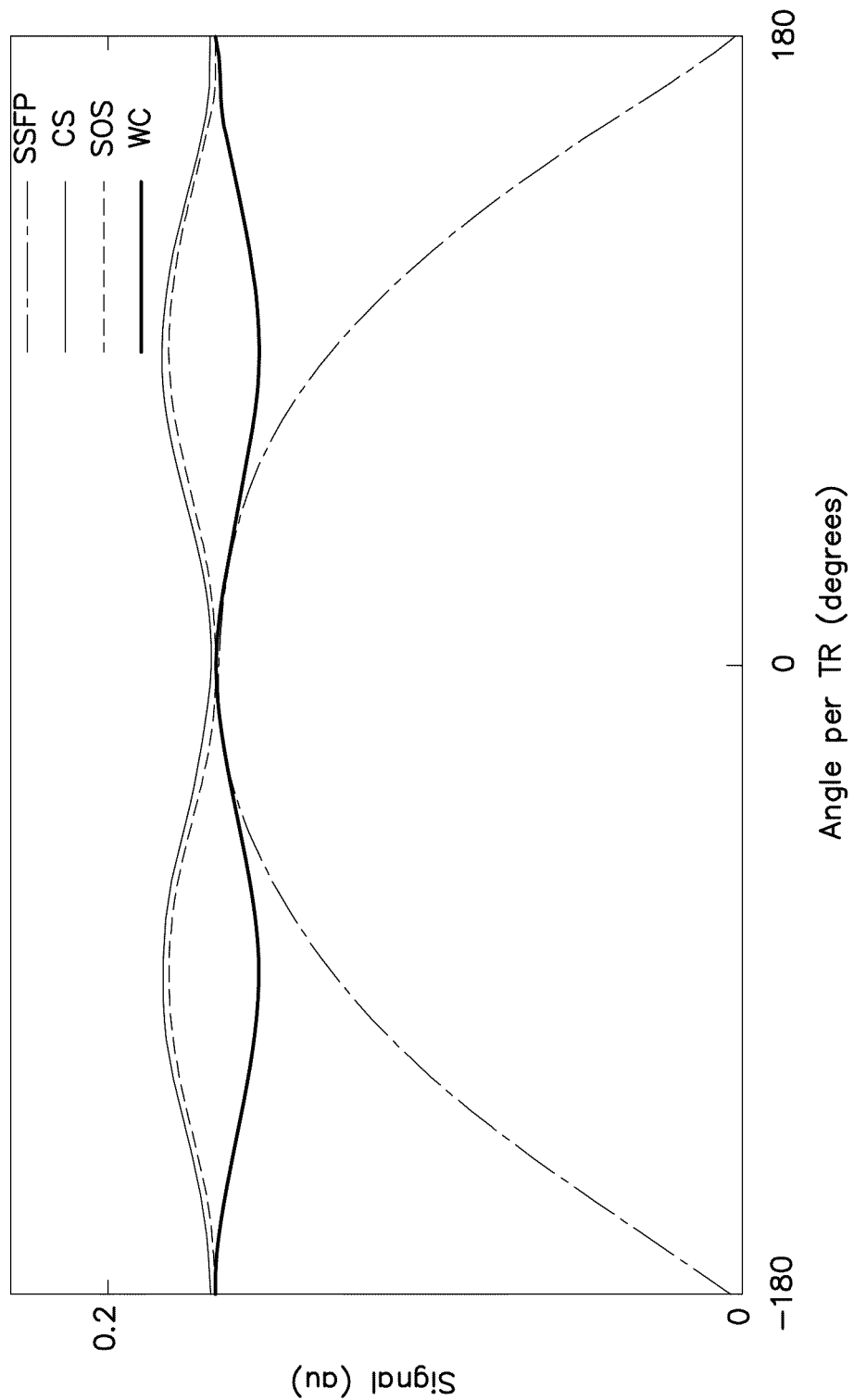
FIG. 7 illustrates spectral profiles for SSFP using complex sums (CS), stun-of-squares (SOS) and weighted combination (WC) methods.

According to some embodiments, a 3D thin-slab free-breathing, ECG gated PV MRI sequence with combined steady-state free precession (SSFP) signals were used to perform effective off-resonance for PV imaging. Some SSFP signals exhibit a unique spectral profile, where signals from spins with certain TR-dependent effective off-resonance frequencies are nulled, causing oft noted banding artifacts. The spectral response of SSFP signals can be shifted with respect to effective off-resonance frequency by RF phase cycling according to the following equation:

$$\phi_n = n \neq \phi_1,$$

where $\phi_n$ is the phase of $n^{th}$ RF pulse. Several methods are proposed that may reduce SSFP banding artifacts by combining multiple SSFP acquisitions with different RF pulse phase cycling schemes. In a complex-sum method, two complex SSFP images acquired with 0-0 and 0-180 RF phase cycles are added together. In a sum-of-squares (SOS) method, the magnitude SSFP images are combined using root mean squares. The major difference between these two methods are that the weighting for each SSFP image is unit in complex-sum method but the complex conjugate of the image itself in the SOS method. As a more general combination method, the weighted combination method (21) uses an exponential power of the SSFP image magnitude as the weighting factor. FIG. 7 shows spectral profiles from the above three SSFP combination methods. In theory, complex addition offers better suppression of banding artifacts; however, the signal-to-noise ration (SNR) suffers from potential phase cancellation between two SSFP signals.

Applicant has recognized that in the presence of effective off-resonance, an optimized steady-state catalyzing pulse for both on-resonance and effective off-resonance spins may be desirable in SSFP imaging to avoid high signal oscillations during the transient state. One method for achieving this includes using a half flip-angle pulse. This method works very well for on-resonance spins, but signal oscillations from effective off-resonance spins may still remain. Several other methods may be used to shorten transient state for effective off-resonance spins including scaling the magnetization close to steady state before imaging in order to shorten transient state duration and using linear systems analysis to solve for the scaling RF pulses. According to other methods, a number of dummy pulses with linearly-increasing flip angles (LFA) may be used. This approach may be extended by adding a pair of binomial magnetization scaling pulses before LFA to further catalyze steady state.

According to some embodiments, free-breathing SSFP imaging with half alpha and catalyzing methods may be used including 10 dummy pulses (constant or linearly increasing angles) immediately followed by signal sampling. The sequence parameters may include TR/TE=3.9/1.4 ms, T1/T2=1000/200 ms, flip angle=90°, 0-180-0-180 RF phase cycling, echo train length=32, according to some embodiments. A constant shimming gradient may also be applied during imaging to create a spatial distribution of effective off-resonance. It should be appreciated that the above parameters are merely exemplary and other imaging sequences may be used, as the aspects of the invention are not limited in this respect.

In choosing PV imaging timing, there are two factors that may be considered: PV flow and left atrium motion. In coronary artery MRI, imaging is commonly performed in mid-diastole to minimize coronary motion artifacts, while early systolic phase is used for coronary vein MRI to take advantage of its maximal size. However, considering the larger diameter and smaller motion of PVs compared to coronary arteries, the motion of PVs may not be as important a factor. Given the greatly increased sensitivity of SSFP to flow effects in the presence of effective off-resonance, it may be desirable to image PV during minimal blood flow. Additionally, the left atrium motion tends to be the least in mid to late diastole, immediately before atrial systole. Therefore, optimal PV imaging trigger delay may be the overlap of minimal left atrium motion and PV flow. However, other timing schemes may be used, as the aspects of the invention are not limited in this respect.

A two-dimensional (2D) free-breathing cine phase contrast gradient echo sequence, prescribed as sagittal slices on both sides of the heart, may be used to measure the time-resolved blood flow velocity in left and right PV. According to some embodiments, the imaging parameters include: TR/TE=5.0/3.0 ms, FOV=320×260 mm$^2$, spatial resolution 2.5×2.5 mm$^2$ reconstructed to 1.25×1.25 mm$^2$, slice thickness 8 mm, and maximum encoding velocity 100 cm/s. A 2D cine breath-held SSFP sequence may be used to obtain a images of the left atrium in the axial orientation with the following parameters: TR/TE=2.6/1.3 ms, $\alpha$=75°, FOV=320×320 mm$^2$, spatial resolution 2.0×2.0 mm$^2$ reconstructed to 1.25×1.25 mm$^2$, slice thickness 8 mm to identify the period of minimal left atrial motion.

According to some embodiments, the following imaging protocol may be used to image PVs. In each scan, scout images may be acquired to localize the anatomy using a SSFP sequence with 3.12×3.12 mm$^2$ in plane resolution and 10 min slice thickness. A reference scan may be acquired using body and phased-array coil(s) to calculate each individual coil sensitivity map. The PVs may be imaged using a 3D ECG gated fat-saturated T2-prep SSFP sequence with a free breathing navigator echo, prescribed axially covering the left atrium and all or a selected amount of the PV's. The imaging parameters may be selected to include: TR/TE=3.9/1.4 ms, FOV=270×400 mm$^2$, $\alpha$=90°, isotropic spatial resolution of 1.8×1.8×1.8 mm$^3$ reconstructed to 0.9×0.9×0.9 mm$^3$. Navigator echoes may be prescribed on the dome of the right hemidiaphragm with a 5-mm acceptance window. An adiabatic T2-prep pulse with 50 ms preparation interval may be used to suppress myocardium signals. To reduce PV signal loss caused by effective off-resonance, two SSFP signals may be sequentially used with 0°-0° and 0°-180° RF phase cycles with the same imaging parameters. Images may be acquired consecutively, one after the other using the same navigator window, training and location.

Figure 8:
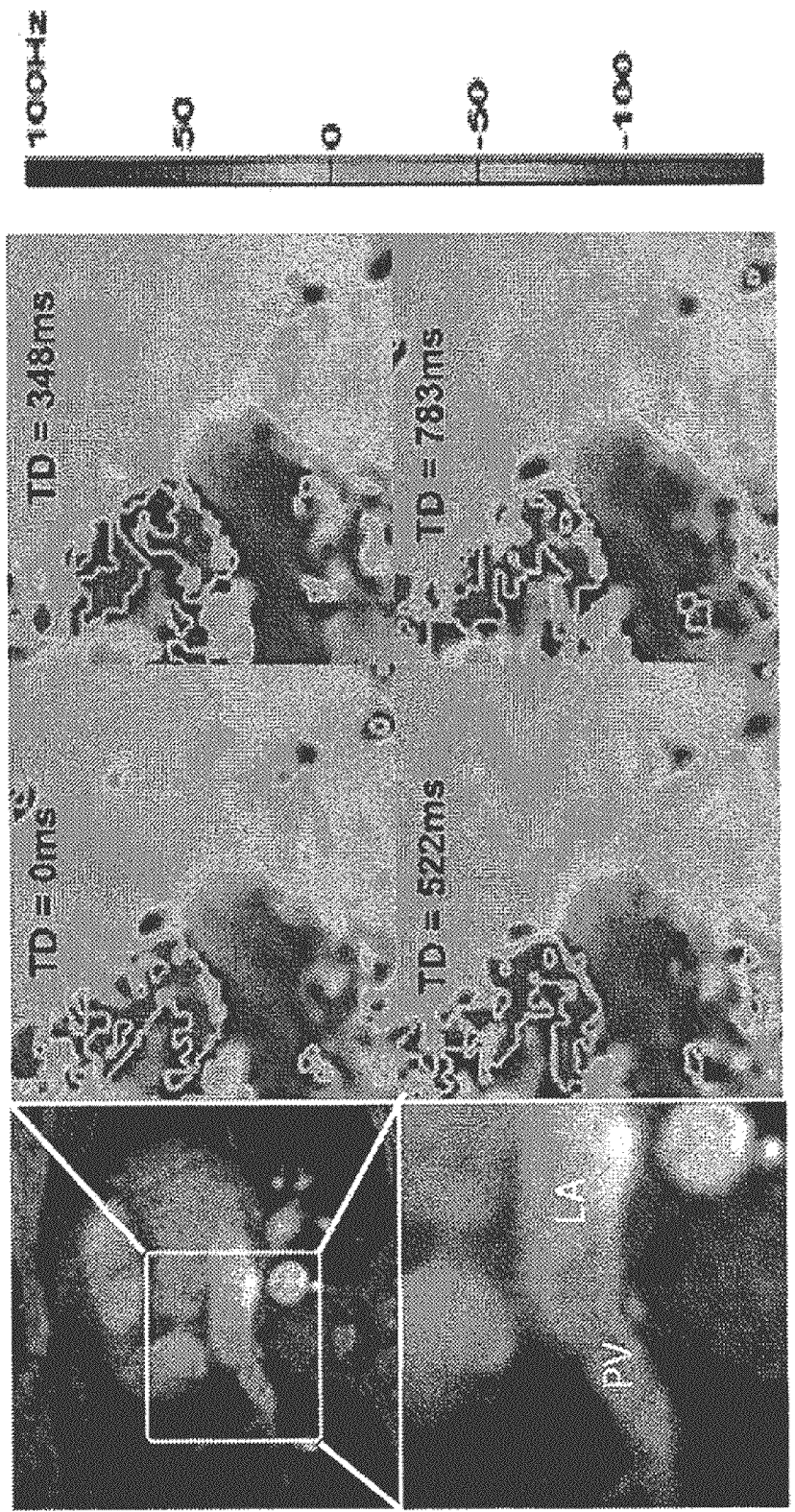
FIG. 8 illustrates an example of a PV magnitude image and corresponding resonance frequency field maps.
Figure 9:
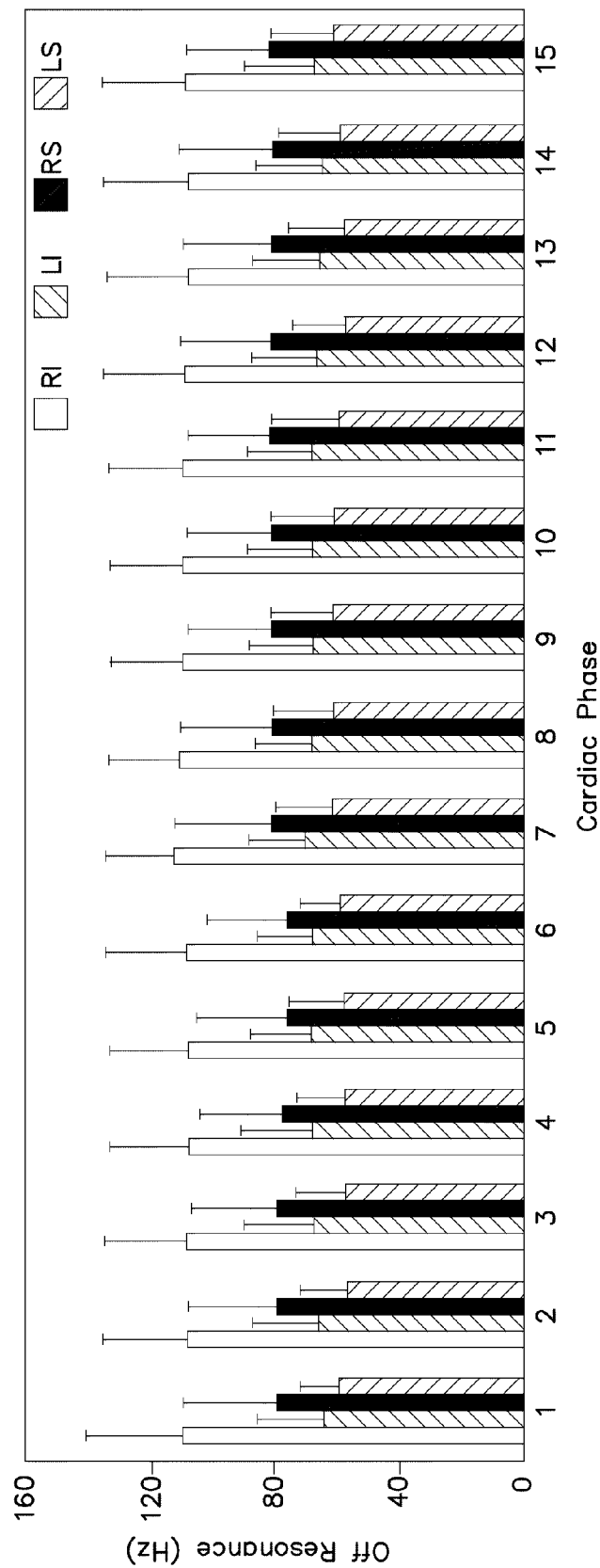
FIG. 9 illustrates the measured average and standard deviation of the measured frequency for each branch through the cardiac cycle.

FIG. 8 shows an example PV magnitude image and corresponding resonance frequency field maps in a healthy adult subject at four different time points during the cardiac cycle. A frequency shift can be seen in the proximal PV throughout the cardiac cycle whereas the blood pool in the left atrium (LA) is on-resonance. The measured average and standard deviation of the measured frequency for each branch through the cardiac cycle is shown in FIG. 9. The mean frequency was measured to be 110±23 Hz, 80±28 Hz, 68±21 Hz and 60±16 Hz for RIPV, RSPV, LIPV and LSPV, respectively. RIPV shows the highest frequency off-set among all four branches. No significant difference in resonance frequency was observed throughout the cardiac cycle in any of the PV branches (p>0.9).

Applicant has demonstrated the presence of significant blood resonance frequency shift in pulmonary vein blood. Results obtained by Applicant show relatively constant frequency shift throughout the cardiac cycle in all PVs with differences between different branches. Preliminary results in a small cohort of subjects shows frequency differences between different individuals, but noticeable frequency shift in all subjects on PV blood. To enable imaging in the presence of such frequency shift, an SSFP imaging sequence may be used with a phased cycling paradigm to take advantages of higher SNR of SSFP. A sum-of-squares combination of two SSFP acquisitions with 0°-0° and 0°-180° RF phase cycles may be used to image PVs. Additionally, the steady-state catalyzing scheme and imaging timing may be generally optimized based on numerical simulation, phantom study and in-vivo experiments. In some circumstances, the magnetization prepared linear flip angle pulse was found to be superior to commonly used half alpha method in catalyzing steady state in the presence of effective off-resonance. Based on measurements of PV blood flow velocity and assessment of left atrium motion, ECG gated PV imaging may be performed at late diastole to minimize flow and motion related artifacts.

According to some embodiments, the sequence may be structurally analogous to 3D coronary MRI SSFP sequences, but with lower spatial resolution. Non-contrast SSFP PV imaging using non-selective RF pulses, high receiver bandwidth, and partial echo may be employed to shorten TR and increase SSFP pass-band width. Imaging may be performed in coronal orientation with a FOV in partition direction 150-250 mm to prevent aliasing; whereas a 60 mm slab in axial orientation is usually sufficient to cover the left atrium and PV. Furthermore, a shorter TR may limit the spatial resolution that can be achieved within a short readout time. The increased field inhomogeneity and RF pulse power deposition at 3 T may limit the use of SSFP with short TR. The sequences proposed herein may be advantageous compared to a single SSFP acquisition because of the wider frequency spectrum.

The sensitivity of SSFP signal profile to effective off-resonance may be used as a source of contrast in functional MRI by considering the steady-state signal phase of effective off-resonance spins. Often, the complex addition method suppresses signal voids better than SOS method. However, the free-breathing SSFP sequence may still utilize transient state imaging, despite optimization of the steady-state catalyzing scheme. This factor, combined with cardiac and respiratory motion, introduces additional phase errors resulting in SOS techniques being more robust in reducing PV signal void than complex addition. However, either technique, or other techniques may be used, as the aspects of the invention are not limited in this respect.

The trigger time may be generally optimized based on PV blood flow velocity and left atrium motion. Another potential factor is the size of PV. According to some embodiments, imaging is performed when the PV has maximal cross-sectional area, which may change significantly during the cardiac cycle. However, PV size is generally maximal during early diastole and minimal during late diastole. For this reason, 2D cine SSFP may be combined with 3D PV MRI to address the PV size variations. However, PVs have relatively large diameters even at mid to end diastole, thus PV size may be less important in optimizing PV imaging timing, considering the potential signal void that may be caused by effective off-resonance PV blood flow and artifacts caused by left atrium motion.

According to one proposed technique, the imaging duration is doubled to acquire images with two different phase cycling, No acceleration imaging may be used to enable more accurate SNR and CNR measurement, however, an acceleration factor of 2 or more can be easily used to reduce total acquisition time. Furthermore, the number of phase encodings per heart beat can be increased to compensate for longer image acquisition without significant impact on image quality. Longer quiescent period of PVs and lower spatial resolutions compared to coronary MRI may allow longer acquisition per cardiac cycle. It should be appreciated that imaging may be performed using ECG triggering or where no ECG gating is used, as the aspects of the invention are not limited in this respect. The above described imaging sequences and protocols are merely exemplary as other imaging sequences to achieve effective off-resonance PV imaging may be used, as the aspects of the invention are not limited in this respect.

Figure 10:
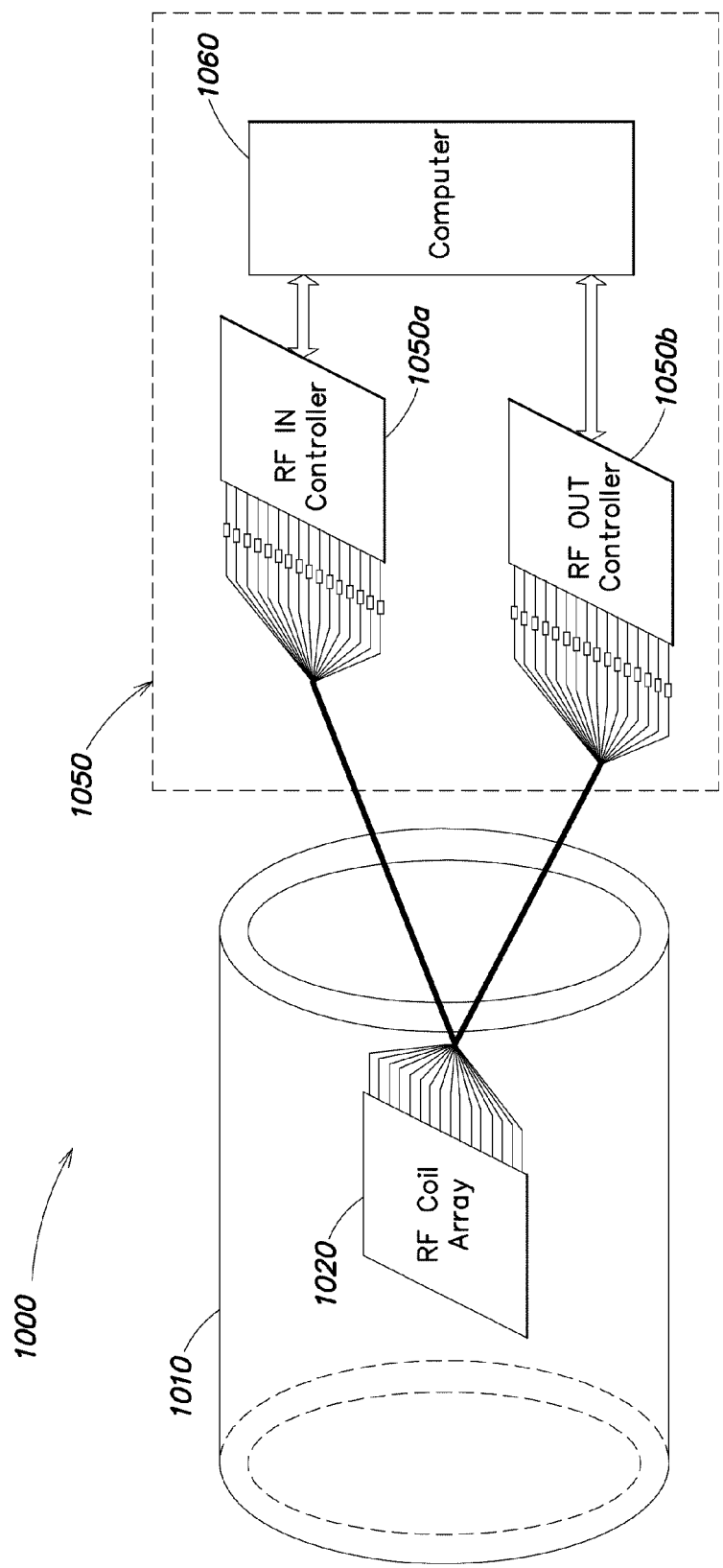
FIG. 10 illustrates an imaging system capable of implementing various imaging protocols for obtaining effective off-resonance images of pulmonary veins.

FIG. 10 illustrates an MR scanner configurable to obtain MR images, and more particularly, to obtain NMR data using various methods described in the foregoing. Specifically, scanner 1000 may be used to implement the various off-resonance PV imaging techniques described herein. Scanner 1000 includes a magnet 1010 capable of producing a magnetic field of desired field strength to align spin properties of molecules of a subject positioned in the interior of the magnet. Magnet 1010 may be any of various MR magnets conventionally used in clinical MRI (e.g., approximately 1.5-3.0 T) or may be a high-field magnet (e.g., 3-7 T or higher) and may produce a uniform or gradient magnetic field. Magnet 1010 may be of any shape, size and strength and is shown as substantially circular in shape for the purposes of schematic illustration only. For example, magnet 1010 may be any magnet or collection of magnets used in clinical or research MRI scanners.

Scanner 1000 includes an array 1020 of one or more RF coils arranged proximate the magnet and adapted to perform at least some MR operations. In particular, the RF coil(s) in coil array 1020 may be adapted to provide RF pulse sequences and to detect NMR signals emitted from an object being imaged. RF coil array may include a single RF coil, or may include multiple RF coils in any configuration, as the aspects of the invention are not limited in this respect. For example, RF coil array 1020 may be an $L(M_t, N_r)$ array where L is the number of coils in the array and $M_t$ and $N_r$ are the number of independent transmit and receive channels, respectively. As stated above, L may indicate a single or multiple coil array.

Scanner 1000 may further include controller 1050 coupled to coil array 1020. Controller 1050 comprises an RF IN controller 1050a and an RF OUT controller 1050b. RF IN controller 1050a is adapted to provide and control RF power to the RF coil array 1020. In particular, RF IN controller 1050a is configured to provide RF power across the M independent transmit channels to respective coils in the array. Similarly, RF OUT controller 1050b is adapted to measure one or more properties of the RF coils over the N independent reception channels in the array. Controller 1050 may be a network analyzer or a custom made controller, signal generator and/or other components adapted to transmit RF power to, and obtain measurements from, coil array 1020.

Controller 1050 may include a computer 1060, either connected to RF IN controller 1050a, RF OUT controller 1050b, or both. Computer 1060 may include one or more programs configured to control various aspects of the RF pulse sequences initiated by RF IN controller 1050a and ultimately provided to an object or region being imaged by coil array 1020. For example, computer 1060 may include one or more programs that define the timing, amplitude, phase and any other signal characteristics of RF pulse sequences to be provided by coil array 1020. In particular, computer 1060 may instruct RF IN controller 1050a to excite the coil array according to any of the various RF pulse sequences described in the foregoing.

Computer 1060 may include one or more programs configured to control the synchronization of controller 1050 and/or control the sequencing of various operations performed by scanner 1000. For example, computer 1060 may be configured to synchronize RF IN controller 1050a and RF OUT controller 1050b to provide RF pulse sequences and detect emitted NMR signals, for example, according to various timing sequences. For example, computer 1060 may be configured to operate the scanner 1000 to perform the various pulse sequences and imaging protocols described herein to perform effective off-resonance PV imaging. Computer 1060 may be configured to operate seamier 1000 to transmit and receive signals according to any desired schedule, as the aspects of the invention are not limited in this respect. Thus, controller 1050 may be configured to deliver any of the various pulse sequences described in the foregoing and/or other appropriate or desired pulse sequences, timing, imaging protocols and parameters.

Having thus described one or more illustrative embodiments, it is to be appreciated that various alterations, modifications, and improvements will readily occur to those skilled in the art. Such alterations, modifications, and improvements are intended to be part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

It should be appreciated that the various methods outlined herein may be coded as software that is executable on one or more processors that employ any one of a variety of operating systems or platforms. Additionally, such software may be written using any of a number of suitable programming languages and/or conventional programming or scripting tools, and also may be compiled as executable machine language code. In this respect, it should be appreciated that some embodiments are directed to a computer-readable medium or multiple computer-readable media (e.g., a computer memory, one or more floppy disks, compact disks, optical disks, magnetic tapes, etc.) encoded with one or more programs that, when executed, on one or more computers or other processors, perform methods that implement the various embodiments described herein. The computer-readable medium or media can be transportable, such that the program or programs stored thereon can be loaded onto one or more different computers or other processors to implement various aspects of the present invention as discussed above.

It should be understood that the term "program" is used herein in a generic sense to refer to any type of computer code or set of instructions that can be employed to program a computer or other processor to implement various aspects of the present invention as discussed above. Additionally, it should be appreciated that according to one aspect of this embodiment, one or more computer programs that, when executed, perform methods of the present invention need not reside on a single computer or processor, but may be distributed in a modular fashion amongst a number of different computers or processors to implement various aspects of the present invention.

It should be appreciated that various aspects of the present invention may be may be used alone, in combination, or in a variety of arrangements not specifically discussed in the embodiments described in the foregoing and is therefore not limited in its application to the details and arrangement of components set forth in the foregoing description or illustrated in the drawings. The invention is capable of other embodiments and of being practiced or of being carried out in various ways. Various aspects of the present invention may be implemented in connection with any type MR imaging equipment of any configuration. No limitations are placed on scanner implementation. Accordingly, the foregoing description and drawings are by way of example only. Moreover, various aspects of the present invention may be practiced with any number of coil types and arrangements. For example, generally planar coils, birdcage coils, surface and volume coils may be used alone or in any combination with the any of the various imaging techniques described herein. Likewise, various aspects may be practiced with any type of detector such as coils, phase sensitive detectors and/or any other type or combination of detectors.

In addition, various aspects of the invention described in one embodiment may be used in combination with other embodiments and is not limited by the arrangements and combinations of features specifically described herein. Various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. A method of inducing nuclear magnetic resonance (NMR) signals from a region of an object having at least a portion of at least one pulmonary vein, the method comprising:

operating at least one coil adapted to emit electromagnetic signals to provide at least one imaging sequence at an effective off-resonance frequency selected to cause NMR signals to be emitted from the at least one pulmonary vein, wherein the effective off-resonance frequency is approximately equal to a resonant frequency of blood in the at least one pulmonary vein; and detecting at least some of the NMR signals to obtain NMR data corresponding to the at least one pulmonary vein.

2. The method of claim 1, wherein the effective off-resonance frequency is achieved by operating the at least one coil such that the at least one imaging sequence is provided at a phase corresponding to the effective off-resonance frequency.

3. The method of claim 1, wherein the effective off-resonance frequency is achieved by operating the at least one coil such that the at least one imaging sequence is provided at the effective off-resonance frequency.

4. The method of claim 1, wherein the at least one imaging sequence has an effective off-resonance frequency that is offset from a resonant frequency of water by an offset between 50-120 Hz.

5. The method of claim 1, wherein the at least one imaging sequence comprises a first plurality of radiofrequency (RF) pulses having a frequency approximately equal to a resonance frequency of water and a phase that results in the first plurality of RF pulses having the effective off-resonance frequency approximately equal to the resonant frequency of blood in the at least one pulmonary vein.

6. The method of claim 5, wherein the plurality of RF pulses forms a steady-state free precession (SSFP) imaging sequence.

7. The method of claim 1, wherein operating the at least one coil further comprises operating the at least one coil to provide at least one preparation sequence adapted to prepare the region for the at least one imaging sequence.

8. The method of claim 7, wherein operating the at least one coil includes operating the at least one coil to provide at least one preparation sequence comprising one or more of the following sequences:
 a T2 preparation sequence adapted to condition the phase coherence of the region;
 a motion preparation sequence to compensate for at least some motion in the region during imaging; and
 a ramp sequence adapted to condition the region in a desired state, the ramp sequence comprising a plurality of RF pulses configured to establish a first flip angle in the region and to ramp up the flip angle to a final flip angle associated with the desired state.

9. At least one non-transitory computer readable medium having processor-executable instructions stored thereon, the processor-executable instructions, when executed by at least one processor, performing a method of inducing nuclear magnetic resonance (NMR) signals from a region of an object having at least a portion of at least one pulmonary vein, the method comprising:
 operating at least one coil adapted to emit electromagnetic signals to provide at least one imaging sequence at an effective off-resonance frequency selected to cause NMR signals to be emitted from the at least one pulmonary vein, wherein the effective off-resonance frequency is approximately equal to a resonant frequency of blood in the at least one pulmonary vein; and
 detecting at least some of the NMR signals to obtain NMR data corresponding to the at least one pulmonary vein.

10. The at least one non-transitory computer readable medium of claim 9, wherein the effective off-resonance frequency is achieved by operating the at least one coil such that the at least one imaging sequence is provided at a phase corresponding to the effective off-resonance frequency.

11. The at least one non-transitory computer readable medium of claim 9, wherein the effective off-resonance frequency is achieved by operating the at least one coil such that the at least one imaging sequence is provided at the effective off-resonance frequency.

12. The at least one non-transitory computer readable medium of claim 9, wherein the at least one imaging sequence has an effective off-resonance frequency that is offset from a resonant frequency of water by an offset between 50-120 Hz.

13. The at least one non-transitory computer readable medium of claim 9, wherein the at least one imaging sequence comprises a first plurality of radiofrequency (RF) pulses having a frequency approximately equal to a resonant frequency of water and a phase that results in the first plurality of RF pulses having the effective off-resonance frequency approximately equal to the resonant frequency of blood in the at least one pulmonary vein.

14. The at least one non-transitory computer readable medium of claim 13, wherein the plurality of RF pulses forms a steady-state free precession (SSFP) imaging sequence.

15. The at least one non-transitory computer readable medium of claim 9, wherein operating the at least one coil further comprises operating the at least one coil to provide at least one preparation sequence adapted to prepare the region for the at least one imaging sequence.

16. The at least one non-transitory computer readable medium of claim 15, wherein operating the at least one coil includes operating the at least one coil to provide at least one preparation sequence comprising one or more of the following sequences:
 a T2 preparation sequence adapted to condition the phase coherence of the region;
 a motion preparation sequence to compensate for at least some of the motion in the region during imaging; and
 a ramp sequence adapted to condition the region in a desired state, the ramp sequence comprising a plurality of RF pulses configured to establish a first flip angle in the region and to ramp up the flip angle to a final flip angle associated with the desired state.

17. A system for inducing nuclear magnetic resonance (NMR) signals from a region of an object having at least a portion of at least one pulmonary vein, the system comprising:
 at least one coil adapted to emit electromagnetic signals to induce an NMR effect;
 at least one detector; and
 at least one controller to operate the at least one coil to provide at least one imaging sequence at an effective off-resonance frequency adapted to cause NMR signals to be emitted from the at least one pulmonary vein, and to operate the at least one detector to detect at least some of the NMR signals to obtain NMR data corresponding to the at least one pulmonary vein,
 wherein the effective off-resonance frequency is approximately equal to a resonant frequency of blood in the at least one pulmonary vein.

18. The system of claim 17, wherein the effective off-resonance frequency is achieved by the at least one controller operating the at least one coil such that the at least one imaging sequence is provided at a phase corresponding to the effective off-resonance frequency.

19. The system of claim 17, wherein the effective off-resonance frequency is achieved by the at least one controller operating the at least one coil such that the at least one imaging sequence is provided at the effective off-resonance frequency.

20. The system of claim 17, wherein the at least one imaging sequence has an effective off-resonance frequency that is offset from a resonant frequency of water by an offset between 50-120 Hz.

21. The system of claim 17, wherein the at least one imaging sequence comprises a first plurality of radiofrequency (RF) pulses having a frequency approximately equal to a resonant frequency of water and a phase that results in the first plurality of RF pulses having the effective off-resonance frequency approximately equal to the resonant frequency of blood in the at least one pulmonary vein.

22. The system of claim 21, wherein the plurality of RF pulses forms a steady-state free precession (SSFP) imaging sequence.

23. The system of claim 17, wherein the controller is adapted to operate the at least one coil to provide at least one preparation sequence adapted to prepare the region for the at least one imaging sequence.

24. The system of claim 23, wherein the at least one controller operates the at least one coil to provide at least one preparation sequence comprising one or more of the following sequences:
- a T2 preparation sequence adapted to condition the phase coherence of the region;
- a motion preparation sequence to compensate for at least some of the motion in the region during imaging; and
- a ramp sequence adapted to condition the region in a desired state, the ramp sequence comprising a plurality of RF pulses configured to establish a first flip angle in the region and to ramp up the flip angle to a final flip angle associated with the desired state.

25. An apparatus, comprising:
at least one processor; and
at least one storage device capable of being accessed by the at least one processor, the at least one storage device storing instructions that, when executed by the at least one processor, induce nuclear magnetic resonance (NMR) signals from a region of an object having at least a portion of at least one pulmonary vein by:
operating at least one coil adapted to emit electromagnetic signals to provide at least one imaging sequence at an effective off-resonance frequency selected to cause NMR signals to be emitted from the at least one pulmonary vein, wherein the effective off-resonance frequency is approximately equal to a resonant frequency of blood in the at least one pulmonary vein; and
detecting at least some of the NMR signals to obtain NMR data corresponding to the at least one pulmonary vein.

26. The apparatus of claim 25, wherein the effective off-resonance frequency is achieved by operating the at least one coil such that the at least one imaging sequence is provided at a phase corresponding to the effective off-resonance frequency.

27. The apparatus of claim 25, wherein the effective off-resonance frequency is achieved by operating the at least one coil such that the at least one imaging sequence is provided at the effective off-resonance frequency.

28. The apparatus of claim 25, wherein the at least one imaging sequence has an effective off-resonance frequency that is offset from a resonant frequency of water by an offset between 50-120 Hz.

29. The apparatus of claim 25, wherein the at least one imaging sequence comprises a first plurality of radiofrequency (RF) pulses having a frequency approximately equal to a resonance frequency of water and a phase that results in the first plurality of RF pulses having the effective off-resonance frequency approximately equal to the resonant frequency of blood in the at least one pulmonary vein.

30. The apparatus of claim 29, wherein the plurality of RF pulses forms a steady-state free precession (SSFP) imaging sequence.

31. The apparatus of claim 25, wherein operating the at least one coil further comprises operating the at least one coil to provide at least one preparation sequence adapted to prepare the region for the at least one imaging sequence.

32. The apparatus of claim 31, wherein operating the at least one coil includes operating the at least one coil to provide at least one preparation sequence comprising one or more of the following sequences:
- a T2 preparation sequence adapted to condition the phase coherence of the region;
- a motion preparation sequence to compensate for at least some motion in the region during imaging; and
- a ramp sequence adapted to condition the region in a desired state, the ramp sequence comprising a plurality of RF pulses configured to establish a first flip angle in the region and to ramp up the flip angle to a final flip angle associated with the desired state.

* * * * *